United States Patent [19]

Nguyen et al.

[11] Patent Number: 4,986,849

[45] Date of Patent: Jan. 22, 1991

[54] SILVER-GLASS PASTES

[75] Inventors: My N. Nguyen, San Diego; Julie H. Wood, Encinnetas; Thomas L. Herrington, Ramona, all of Calif.

[73] Assignee: Johnson Matthey Inc., Valley Forge, Pa.

[21] Appl. No.: 248,120

[22] Filed: Sep. 23, 1988

[51] Int. Cl.$^5$ .............................................. B05B 00/00
[52] U.S. Cl. .................................. 106/1.14; 106/1.19; 252/514
[58] Field of Search ....................... 252/500, 514, 512; 106/1.14; 524/439, 440

[56] References Cited

U.S. PATENT DOCUMENTS

| | | | |
|---|---|---|---|
| 3,497,774 | 2/1970 | Hornberger et al. | 317/101 |
| 4,273,583 | 6/1981 | Sycain | 75/251 |
| 4,401,767 | 8/1983 | Dietz et al. | 501/109 |
| 4,436,785 | 3/1984 | Dietz et al. | 106/1.14 |
| 4,459,166 | 7/1984 | Dietz et al. | 156/89 |
| 4,636,254 | 1/1987 | Husson, Jr. et al. | 106/1.14 |
| 4,761,224 | 8/1988 | Husson, Jr. et al. | 106/1.14 |
| 4,859,241 | 8/1989 | Grundy | 252/514 |

*Primary Examiner*—Josephine Barr
*Attorney, Agent, or Firm*—Cushman, Darby & Cushman

[57] ABSTRACT

An improved silver-glass paste for bonding a silicon die to a ceramic substrate consisting essentially of silver flake, lead borate glass, resin, surfactant containing lyophilic and lyophobic groups and solvent. The surfactant provides a steric barrier around the silver and glass to stabilize the paste and reduce voiding and cracking when the paste is used to bond the die to the substrate.

4 Claims, 1 Drawing Sheet

SILVER-GLASS PASTES

BACKGROUND OF THE INVENTION

The present invention relates to improved silver-glass paste compositions for use in attaching semiconductive elements, e.g., silicon dies, to appropriate substrates.

Prior patents directed to this type of paste include U.S. Pat. Nos. 3,497,774; 4,401,767; 4,436,785; 4,459,166; 4,636,254 and 4,761,224. Typically, these pastes are used for attaching silicon dies to ceramic substrates.

The aforementioned pastes generally comprise the following essential components in the ranges indicated:

| Component | % by Weight |
|---|---|
| silver flake | 55–75 |
| lead borate glass frit | 10–25 |
| resin | 0.5–2% |
| organic vehicle | 5–20% |

Other additives, e.g., silver oxide, thixotropic agents, or the like may also be included.

In a representative die-attachment process, the paste comprising silver flake, glass frit, resin and vehicle is placed in a cavity in a ceramic substrate, the die is placed on the paste and the resulting die/substrate package is fed on a belt onto and through a furnace where the package is heated to remove the organic vehicle and sinter the residual silver and glass to bond the die firmly to the substrate. The final bond layer must be completely free of voids and, as a consequence, the process usually requires a preliminary drying step where vehicle is evaporated followed by firing in the furnace to remove residual vehicle and melt the glass.

The preliminary drying step of necessity is quite lengthy, requiring between about 2–10 hours at 60–80° C., depending on, for example, the die size. Additionally, the ramp rate, i.e., the rate at which the package is fed from the drying step into the furnace, is carefully controlled so as to ensure that organic burnout is at least essentially completed before the sintering of the silver-glass mix takes place. Relatively low temperature (e.g., up to 50° C./minute) ramp rates are very commonly used to insure vehicle removal and optimum results. Belt-type furnaces are normally employed for the firing stage and, depending on the number of temperature zones involved, the dwell time in the furnace can vary from 30–90 minutes or more. Overall, therefore, from preliminary drying through firing, the processing time for effectively attaching a silicon die to a ceramic substrate is a relatively lengthy one.

BRIEF DESCRIPTION OF THE INVENTION

The pastes of the invention permit the elimination of the preliminary drying step and faster overall processing to provide a void- and crack-free bond layer for die attachment. These pastes can be effectively used in a single pass through the furnace at a high temperature ramp rate without sacrificing performance requirements. Other advantages of the present pastes will be hereinafter apparent.

Broadly speaking, the pastes of the invention are characterized by including a small amount of one or more ionic or nonionic surfactants which include both a lyophobic group and a lyophilic group with the basic paste components (silver flake, glass frit and vehicle). This additive has been found to enhance stability of the paste so as to avoid or minimize aggregation or settling of the silver and glass particles with consequent overall improvement in the performance of the paste. Additionally, the surfactant additive functions to permit use of the paste without a preliminary drying step and at a faster ramp rate (e.g., 90° C./min) to give a bond layer which is essentially free from voids and/or cracks.

The silver and glass components in conventional pastes have a tendency to flocculate because of Van der Waals attractive forces and the resulting increase in free energy of the system when the silver and glass particles are separated from each other. It appears that by using the surfactant additive of the invention, i.e., a surfactant containing a lyophobic group which has very little, if any, attraction for the solvent or organic vehicle together with a lyophilic group which has a strong attraction for the vehicle, the tendency for flocculation to occur is reduced and paste stability consequently enhanced. Without intending to be limited to any particular theory of operation, it appears that the lyophobic group of the surfactant is adsorbed onto the surface of silver or glass particles to form a steric barrier to the vehicle while the lyophilic portion or "tail" of the surfactant extends into the vehicle or steric layer. Flocculation of particles is inhibited by thickening the steric barrier and physically keeping dispersed particles apart and by reducing the efficiency of interparticle collision. This results in enhanced paste stability with consequent advantages as noted above, e.g., the possibility of eliminating the drying step, faster heating rates with reduced time to obtain a void- and crack-free bond between silicon die and substrate.

DETAILED DESCRIPTION OF THE INVENTION

A wide variety of surfactants may be used for present purposes provided they include both a lyophobic group and a lyophilic group and are stable at temperatures above about 300° C., i.e., close to or above the temperature where sintering of the silver-glass mix begins. Advantageously the lyophobic group is a long chain hydrocarbon radical while the lyophilic group is an ionic or highly polar group. As examples of lyophobic groups, there may be mentioned:

$C_8$–$C_{20}$ straight or branched chain alkyl;

phenyl groups substituted with $C_8$–$C_{20}$ alkyl;

naphthyl groups substituted with alkyl containing 3 or more carbons;

rosin derivatives;

high molecular weight propylene oxide polymers (polyoxypropylene glycol derivatives); or the like.

As the lyophilic component, there may be mentioned such nonionic materials as the monoglyceride of long chain fatty acids of the formula $RCOOCH_2CHOHCH_2OH$ where R is a long chain alkyl (e.g., $C_{12}$ or more) and/or polyoxyethylenated alkyl phenols of the formula $R-C_6H_4(OC_2H_4)_xOH$ where R is alkyl of 8 to 20 carbons and x is an integer, e.g., from 1 to 70, sulfated derivatives thereof and the alkali metal salts of such derivatives.

As specific examples of surfactants containing both lyophobic and lyophilic groups suitable for use herein, there may be mentioned: Triton X (the sodium salt of an octylphenol which is ethoxylated and sulfated), Pluronic (ethylene oxide propylene oxide block copolymer), Tetronic (fatty amine ethoxylate), Post-4 (hydrogenated castor oil), Tinagel (fatty amine ethoxylate), Lecithin (B-N-alkylamino propionic acid).

The amount of surfactant used can be relatively widely varied and will depend, at least to some extent, on the surfactant employed. Usually, however, the surfactant will comprise from 0.05-2% by weight of the paste, i.e., based on the total weight of silver, glass, resin, solvent and surfactant.

The surfactant may be added at any convenient stage in the formulation of the paste. In one preferred embodiment, the silver flake, resin and solvent are mixed together with the surfactant and the glass added thereafter. Alternatively, however, all of the components may be mixed together at one time until a homogeneous formulation is obtained. Usually low shear mixing for 2-6 hours is adequate to provide a homogeneous composition.

Apart from the addition of the ionic or nonionic surfactant as described, the paste includes conventional components. Preferably, the silver flake has a surface area of 0.5-1.0 $m^2/g$ and a tap density of 2.5-4.0 gram/cc. For present purposes, it is desirable that the silver flake is essentially uniform in size although variations may result in the flake as milled. The amount of flake used can be varied but usually will fall in the range of 55-75%, based on the total weight of the paste.

The glass component is lead borate glass frit which is silica- and sodium-free. Normally this glass will comprise a lead borate frit having a softening point in the range of 325° C. to 425° C., a coefficient of thermal expansion no higher than about 15 ppm/° C., a surface area of at least about 0.3 $m^2/gm$ and a tap density of up to about 4 gm/cc. Usually the glass will comprise 10-25% of the weight of the paste.

A variety of different resin components can be used for present purposes. This includes lower alkyl methacrylates such as methyl, ethyl or isobutyl methacrylate, the latter being preferred. This component usually comprises from about 0.5-2.0% by weight of the paste.

The composition of the solvent can be widely varied. However, the solvent should be one which has a boiling range of 120-200° C. This allows for a one pass paste that requires no drying. A particularly useful solvent comprises an alcohol, notably 2-octanol, preferably in mixture with minor amounts (e.g., 1-20% by weight of the solvent total) of additives such as benzyl alcohol and 4-hydroxy-3-methoxy benzaldehyde. Normally the paste will include 10-20% solvent, on a weight basis.

Other additives may also be included in the pastes of the invention, e.g., silver oxide, a thixotrope, without departing from the invention.

The invention is illustrated, but not limited, by the following examples showing preparation and use of representative compositions of the invention:

EXAMPLE A

The following composition was prepared by blending together the indicated components in the amounts stated:

| | | |
|---|---|---|
| silver flake | about | 69% |
| lead borate glass | about | 17% |
| isobutyl methacrylate | about | 1% |
| ethyleneglycol diacetate | about | 6% |
| 2,2,4 trimethylpentanediol-1,3 monoisobutyrate | about | 7% |
| | | 100% |

This composition, designated A, does not include any surfactant according to the invention, and was used for comparison purposes as described below.

EXAMPLE B

Example A was repeated except that 0.3% of the surfactant "Post-4" was included in the composition to give a composition B.

EXAMPLE C

Example B was repeated except that the "Post-4" was replaced by 0.5 parts of Triton-X.

Triton-X is an octylphenoxypolyethoxyethanol wherein the lyophobic group is a phenyl alkyl group and the lyophilic group is polyethoxyethanol.

EXAMPLE D

Example B was repeated except that 0.5 parts of lecithin was used as the surfactant additive in place of "Post-4".

EXAMPLE E

Example B was repeated except that in this case the surfactant was 0.5 parts "Tinegal", a nonionic alkoxylate.

The compositions of Examples A-E were used to bond a conventional silicon die to a bare ceramic substrate. The process used involved applying the paste to a die cavity on the ceramic substrate, placing the die on the paste and passing the resulting package through a conventional belt furnace to bond the die to the substrate. The ramp rate was 90° C./minute. No preliminary drying step was used. The furnace was operated at a peak temperature of 430° C. The firing process was completed in 20 minutes. After cooling, the bond between the die and substrate was examined for percentage voids, percentage cracks and adhesion (lbs. per inch). The results are tabulated below:

TABLE 1

| Composition | % Additive | % Void | % Crack | Adhesion (lb) |
|---|---|---|---|---|
| A | 0 | 20 | 25 | 29 |
| B | 0.3 (Post-4) | 6 | 0 | 26 |
| C | 0.5 (Triton-X) | 6 | 7 | 36 |
| D | 0.5 (Lecithin) | 4 | 6 | 25 |
| E | 0.5 (Tinegal) | 6 | 0 | 28 |

The foregoing results show that in each instance the use of surfactant (Examples B-E) gave a bond with significantly less voids and cracks while maintaining essentially the same adhesion. It is believed the formation of a steric barrier by the use of the surfactant produced a more stable and homogeneous system and hence reduced the voids. This barrier also seems to slow down the sintering rate of silver-glass mixture and thereby eliminates cracks in a single pass, fast ramp temperature process.

The invention and it advantages are further illustrated by the drawings wherein.

Figure 1A:
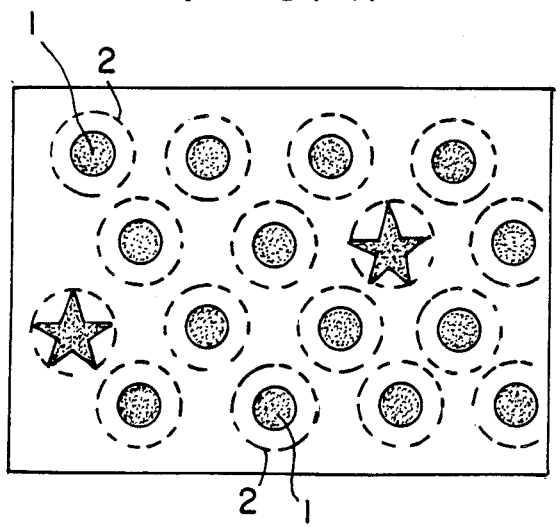
FIG. 1A shows the stable system obtained using the additive according to the invention.

Referring more specifically to the drawings, FIG. 1A shows how the particles (1) of silver-glass are stabilized with the surfactant additive providing a steric barrier (2) with respect to the organic solvent or vehicle which preferably is a mixture of organic liquids.

Figure 1B:
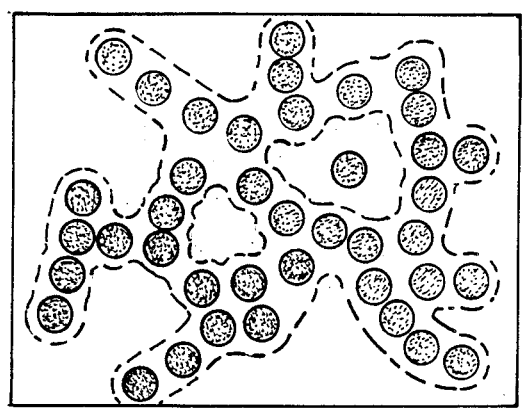
FIG. 1B shows the flocculated system which results without the additive.

FIG. 1B shows how the particles tend to flocculate without the additive thus leading to voids and cracking when the vehicle is removed.

Figure 2:
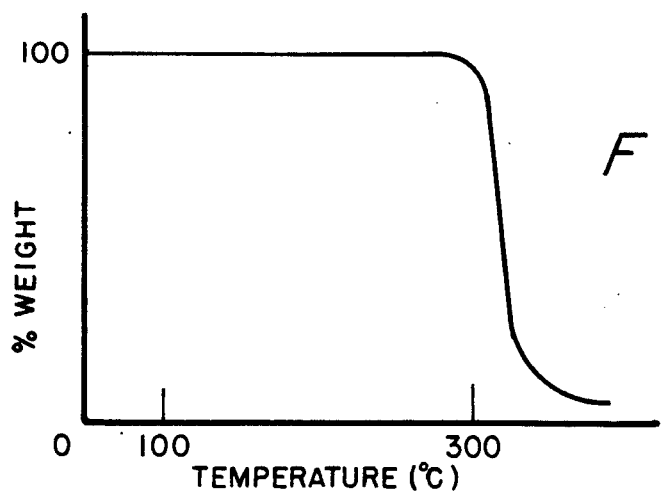
FIG. 2 is a representative thermal analysis graph for surfactants suitable for use according to the invention.

FIG. 2 illustrates that typically suitable surfactants, e.g., Triton-X or lecithin, are thermally stable up to 300° C. or so at or near the temperature where sintering of the silver-glass mixture starts to occur. It appears that it is this stability of the steric surfactant barrier to temperatures up to 300° C. that helps to control the rate of sintering with elimination of, or reduction in, cracks and voids.

Figure 3:
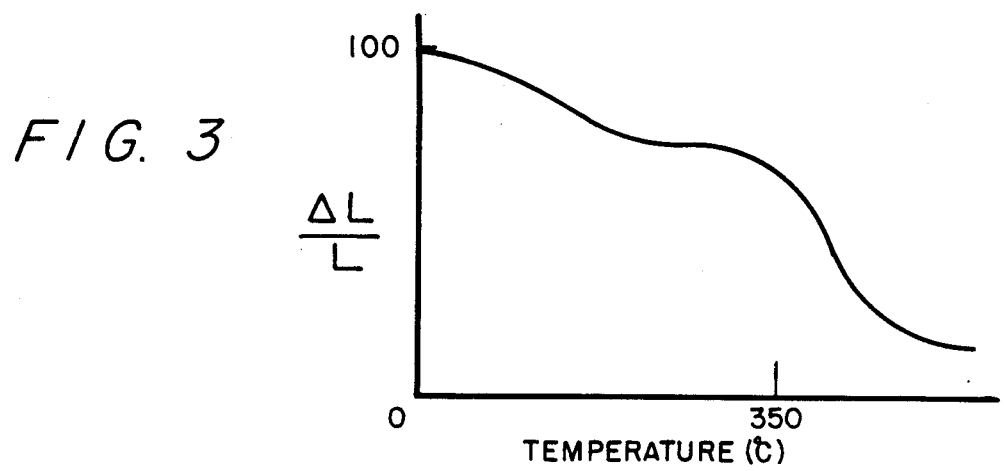
FIG. 3 is a typical thermal mechanical analysis graph for a silver-glass mixture.

FIG. 3 shows that the conventional silver-glass mix begins to sinter at around 350° C. where the ΔL/L significants drops off. In this connection, it is noted that L represents initial thickness while ΔL is the change in thickness.

It will be appreciated that various modifications are contemplated. Hence, the invention is defined in the following claims wherein:

We claim:

1. In a silver-glass paste consisting essentially of silver flake, lead borate glass frit, resin and organic vehicle, the improvement which comprises including a surfactant, in an amount of from 0.05–2% by weight of the paste and sufficient to stabilize the paste, said surfactant being stable at a temperature above about 300° C. and being one which comprises a lyophobic hydrocarbon or hydrocarbonoxy group and an ionic or highly polar lyophilic group.

2. The paste of claim 1 including 55–75% silver flake, 10–25% lead borate glass and 0.5–2% resin.

3. The composition of claim 1 wherein the lyophobic hydrocarbon or hydrocarbonoxy group is selected from $C_8$–$C_{20}$ alkyl, phenyl substituted with $C_8$–$C_{20}$ alkyl, naphthyl substituted with alkyl of at least 3 carbon atoms, and high molecular weight propylene oxide polymers; and the lyophilic group is selected from the monoglycerides of long chain fatty acids, polyoxyethylenated alkyl phenols and the sulfates or alkali metal salts thereof.

4. The composition of claim 1 wherein the surfactant is the sodium salt of an octyl phenol which is ethoxylated and sulfated, ethylene oxide-propylene oxide block copolymer, fatty amine ethoxylate, hydrogenated castor oil or (3-N-alkylamino propionic acid.

* * * * *